United States Patent
Huang et al.

(10) Patent No.: US 9,516,785 B2
(45) Date of Patent: Dec. 6, 2016

(54) PORTABLE ELECTRONIC DEVICE

(71) Applicant: Acer Incorporated, New Taipei (TW)

(72) Inventors: Yi-Ta Huang, New Taipei (TW);
Wen-Chieh Tai, New Taipei (TW);
Cheng-Nan Ling, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 14/807,878

(22) Filed: Jul. 23, 2015

(65) Prior Publication Data
US 2016/0330864 A1  Nov. 10, 2016

(30) Foreign Application Priority Data
May 8, 2015  (TW) .............................. 104114718 A

(51) Int. Cl.
G06F 1/20 (2006.01)
H05K 7/20 (2006.01)

(52) U.S. Cl.
CPC ............ *H05K 7/20145* (2013.01); *G06F 1/203* (2013.01); *H05K 7/20209* (2013.01)

(58) Field of Classification Search
CPC ........ G06F 1/203; G06F 1/20; H05K 7/20145; H05K 7/20209
USPC ............ 361/679.48, 694, 695, 679.55, 679.6
See application file for complete search history.

(56) References Cited

U.S. PATENT DOCUMENTS 6,496,369 B2 * 12/2002 Nakamura ............ G06F 1/1616
165/80.3
8,014,147 B2 * 9/2011 Chen ..................... G06F 1/1616
200/61.62

FOREIGN PATENT DOCUMENTS

| CN | 101382228 | 9/2010 |
|---|---|---|
| TW | I359356 | 3/2012 |
| TW | I470408 | 1/2015 |

OTHER PUBLICATIONS

STIC Search Report.*

* cited by examiner

*Primary Examiner* — Dion R Ferguson
*Assistant Examiner* — Mandeep S Buttar
(74) *Attorney, Agent, or Firm* — Jianq Chyun IP Office

(57) ABSTRACT

The electronic portable device of the invention includes a housing, a lifting mechanism, a controlling unit, and a heat dissipation fan. The housing includes an opening. The lifting mechanism is movably disposed in the housing and corresponds to the opening. The lifting mechanism is configured to move toward or away from the opening. The control unit is coupled to the lifting mechanism and configured to control the lifting mechanism to move toward or away from the opening. The heat dissipation fan is disposed on the lifting mechanism and corresponds to the opening. When the lifting mechanism moves towards the opening, the heat dissipation fan is lifted toward the opening by the lifting mechanism, and is protruded from an outer surface of the housing through the opening.

10 Claims, 2 Drawing Sheets

PORTABLE ELECTRONIC DEVICE

CROSS-REFERENCE TO RELATED APPLICATION

This application claims the priority benefit of Taiwan application serial no. 104114718, filed on May 8, 2015. The entirety of the above-mentioned patent application is hereby incorporated by reference herein and made a part of this specification.

BACKGROUND OF THE INVENTION

Field of the Invention

The invention relates to an electronic device, and more particularly, to a portable electronic device.

Description of Related Art

With the development of technologies in recent years, electronic devices such as notebook, tablet PC, and smart phone have frequently appear in daily life. During operation, such electronic devices usually generate heat, which can affect the operation efficiency. As a result, the interiors of electronic devices are frequently configured with heat dissipation modules or elements in order to assist the dissipation of heat out of the electronic devices.

Heat dissipation fan is a common element of electronic heat dissipation technology. It is usually used with heat-dissipating fins to dissipate heat generated by high-power elements in order to maintain the temperature of the element to its working temperature. Additionally, the active flow generated by the fan causes convection between the interior and the exterior of the electronic device, therefore effectively reduce the temperature of the interior of the electronic device. However, when operating in high performance mode, the faster the performance, the more heat is generated, causing a large amount of heat in portable electronic devices. Aggravated by miniaturization of portable devices, it is difficult to dissipate the large amount of heat using the above-described heat dissipation method.

SUMMARY OF THE INVENTION

The invention provides a portable electronic device capable of increasing the air flow of heat dissipation fans, thus effectively increasing the efficiency of heat dissipation.

The electronic portable device of the invention includes a housing, a lifting mechanism, a control unit, and a heat dissipation fan. The housing includes an opening. The lifting mechanism is movably disposed in the housing and corresponds to the opening. The lifting mechanism is configured to move toward or away from the opening. The control unit is coupled to the lifting mechanism and configured to control the lifting mechanism to move toward or away from the opening. The heat dissipation fan is disposed on the lifting mechanism and corresponds to the opening. When the lifting mechanism moves towards the opening, the heat dissipation fan is raised toward the opening by the lifting mechanism, and protrudes from an outer surface of the housing through the opening.

Based on the above, in the invention, the opening is disposed on the housing, the heat dissipation fan is disposed on the lifting mechanism, and the control unit is coupled to the lifting mechanism to control the lifting mechanism to move toward or away from the opening, thereby moving the heat dissipation fan to protrude from the outer surface of the housing or move back in the housing to the initial position. With the disposition stated above, when the demand of heat dissipation of the portable electronic device is greater than certain level, the control unit can control the lifting mechanism to raise the heat dissipation fan to protrude from the outer surface of the housing through the opening, such that the heat convection is increased significantly, thus significantly increasing the heat dissipation efficiency of the portable electronic device. As a result, the portable electronic device of the invention improves the efficiency of heat dissipation of the portable electronic device when the portable electronic device is in high demand for heat dissipation.

To facilitate understanding of the features and benefits of the invention, refer to explanations with figures below.

DESCRIPTION OF THE EMBODIMENTS

Figure 1:
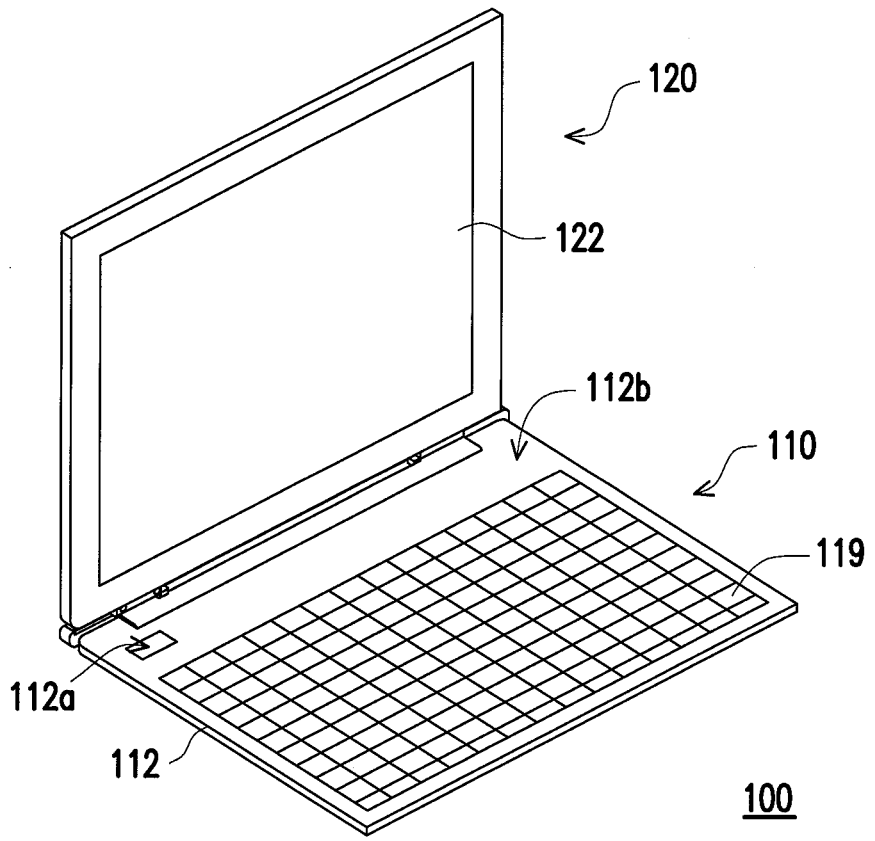
FIG. 1 is a schematic view of a portable electronic device according to an embodiment of the invention.

The description of the invention and other technical contents, features, and benefits are more clearly presented in the embodiments with the figures below. Words of direction referred to in the embodiments below, such as "up," "down," "forward," "backward," "left," "right," etc. refer to directions in the figures only. As such, the words of direction are used to illustrate instead of limiting the invention. Also, in the embodiments below, identical or similar reference numerals are adopted for identical or similar elements.

FIG. 1 is a schematic of a portable electronic device of an embodiment of the invention. Referring to FIG. 1, in the present embodiment, the portable electronic device 100 may be a notebook computer which may, as shown in FIG. 1, include a first body 110 and a second body 120, wherein the second body 120 is pivotally connected to the first body 110 to rotate with respect to the first body 110. Specifically, the first body 110 may include a housing 112 and a keyboard module 119, and the second body 120 may include a display 122. The invention does not limit the types of the portable electronic device 100. In another embodiment, the portable electronic device may also be a tablet PC.

Figure 2:
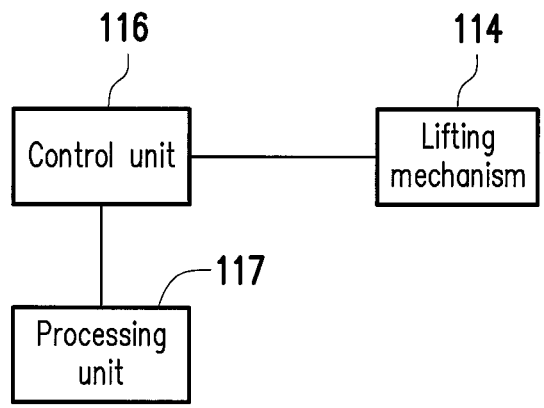
FIG. 2 is a system block diagram of the portable electronic device in FIG. 1 according to an embodiment of the invention.
Figure 3:
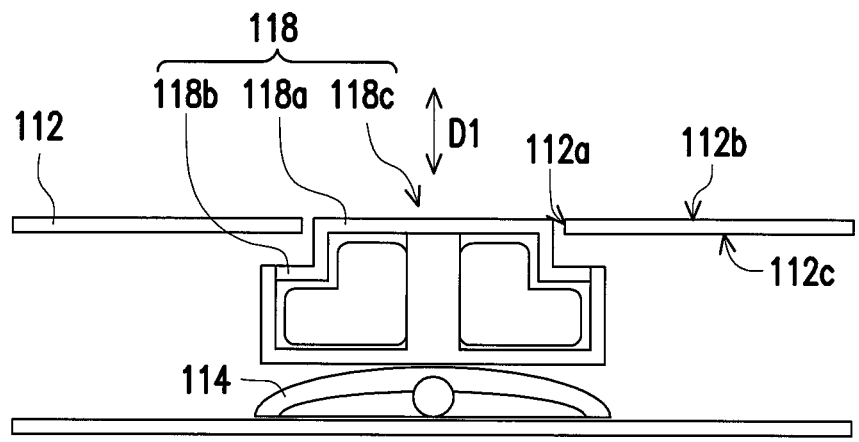
FIG. 3 is a cross-section view of the portable electronic device in FIG. 1 in normal state.
Figure 4:
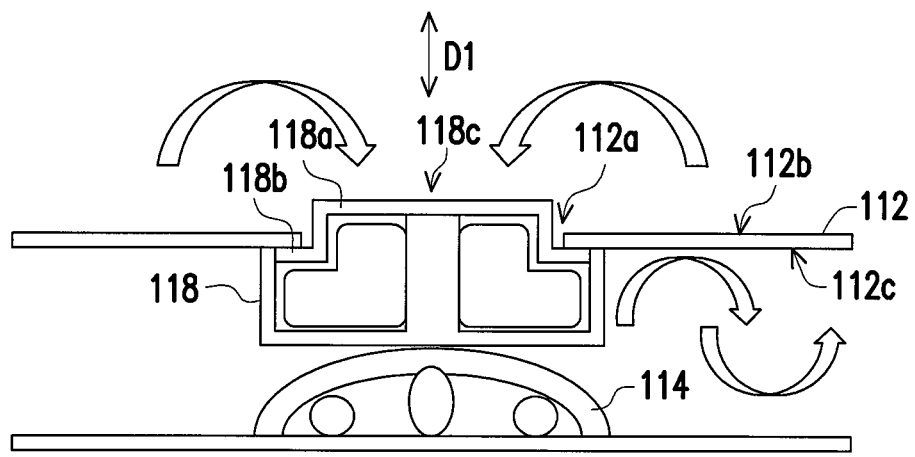
FIG. 4 is a partial cross-section view of the portable electronic device in FIG. 1 in advanced heat dissipating state.

FIG. 2 is a system block diagram of the portable electronic device in FIG. 1. FIG. 3 is a cross-section view of the portable electronic device in FIG. 1 in normal state. FIG. 4 is a cross-section view of the portable electronic device in FIG. 1 in advanced heat dissipating state. Referring to FIGS. 2-4, in detail, in the present embodiment, the portable electronic device 100 includes the housing 112, a lifting mechanism 114, a control unit 116, and a heat dissipation fan 118. The housing 112 includes an opening 112a. The lifting mechanism 114 as shown in FIG. 3 is raised and lowered in the housing 112, and the lifting mechanism 114 is disposed to correspond to the opening 112a. Specifically, the lifting mechanism 114 is configured to move toward to or away from the opening 112 along a lifting/lowering direction D1. The control unit 116 is coupled to the lifting mechanism 114 as shown in FIG. 2, and is configured to control the lifting mechanism 114 to move toward or away from the opening 112a.

As described above, the heat dissipation fan 118 is disposed on the lifting mechanism 114 to move along with the lifting mechanism 114, and the heat dissipation fan 118 is disposed to correspond to the opening 112a. With the disposition stated above, when the lifting mechanism 114 as shown in FIG. 4 moves toward the opening 112a, the heat dissipation fan 118 is raised toward the opening 112a with the lifting mechanism 114 and protrudes from an outer surface 112b of housing 112 through the opening 112a. In the present embodiment, the outer surface 112b may be the surface of the first body 110 facing the second body 120 as shown in FIG. 1. The invention does not limit the location of the outer surface 112b. The outer surface 112b may also be the surface of the first body 110 facing away from the second body 120. In other words, the heat dissipation fan 118 may protrude from the housing 112 through the surface of the first body 110 facing away from the second body 120.

In the present embodiment, the heat dissipation fan 118 includes an air inlet 118c, which is disposed corresponding to the opening 112a. With the disposition stated above, when the heat dissipation fan 118 is raised by the lifting mechanism 114 towards the opening 112a, the air inlet 118c may protrude from the outer surface 112b through the opening 112a and increase the air flow of the heat dissipation fan 118, thereby increasing the heat convection in the portable electronic device and improving heat dissipation.

In an embodiment of the invention, the portable electronic device 100 further includes a processing unit 117 coupled to the control unit 116. With the disposition stated above, when the portable electronic device 100 is switched to an overclock mode, that is, when processing unit 117 is overclocked, a frequency of a clock domain signal is higher than a standard frequency value, the control unit 116 controls the lifting mechanism 114 to move toward the opening 112a for raising the heat dissipation fan 118, such that the heat dissipation fan 118 protrude from the outer surface 112b of the housing 112. In short, the operation of the control unit 116 controlling the lifting mechanism 114 to move toward the opening 112a is in response to the portable electronic device 100 being switched to the overclock mode. Therefore, when the portable electronic device 100 is switched to the overclock mode, the heat dissipation fan 118 is raised to protrude from the outer surface 112b of the housing 112 to significantly increase the heat convection (the directions of airflow are illustrated as the arrows in FIG. 4).

With the disposition stated above, when the portable electronic device 100 is switched from the overclock mode back to a normal mode, in other words, when a frequency of a clock domain signal is reduced back to a standard frequency value, the control unit 116 can control the lifting mechanism 114 to move away from the opening 112a, so that the heat dissipation fan 118 is lowered to its initial position in the housing 112. In short, the operation of the control unit 116 controlling the lifting mechanism 114 to move away from the opening 112a is in response to the portable electronic device 100 being switched back to the normal mode. As a result, when the portable electronic device 100 is switched back to the normal mode, the heat dissipation fan 118 can be returned back to the initial position in the housing 112 and continue to dissipate heat in the normal mode.

In another embodiment, the control unit 116 can also control the lifting mechanism 114 to move toward or away from the opening 112a based on whether a working temperature of the electronic portable device 100 exceeds a predetermined temperature or not. More particularly, when the working temperature of the portable electronic device 100 exceeds the predetermined temperature, the control unit 116 can control the lifting mechanism 114 to move toward the opening 112a, thereby raising the heat dissipation fan 118 to protrude from the outer surface 112b of the housing 112. In short, the operation of the control unit 116 controlling the lifting mechanism 114 to move toward the opening 112a is in response to the working temperature of the portable electronic device 100 exceeding the predetermined temperature. As a result, when the working temperature of the portable electronic device 100 exceeds the predetermined temperature, the heat dissipation fan 118 is raised to protrude from the surface 112b of the housing 112 to significantly increase the heat convection and the heat dissipation efficiency.

As described above, the heat dissipation fan 118 can continue to dissipate heat of the portable electronic device 100 while protruding from the outer surface 112b of the housing 112. When the temperature of the portable electronic device 100 is decreased till equal to or below the predetermined temperature, the control unit 116 can then accordingly control the lifting mechanism 114 to move away from the opening 112a, thereby causing the heat dissipation fan 118 to be lowered to the initial position in the housing 112. In short, the operation of the control unit 116 controlling the lifting mechanism 114 to move away from the opening 112a is in response to the working temperature of the portable electronic device 100 decreasing till equal to or below the predetermined temperature. As a result, when the working temperature of the portable electronic device 100 decreases till equal to or below the predetermined temperature, the heat dissipation fan 118 can then be returned back to the initial position in the housing 112 and continue to dissipate heat in the normal mode.

In particular, the heat dissipation fan 118 can, as shown in FIG. 4, include a protruding portion 118a and a leaning portion 118b. The air inlet 118c described above is disposed on the protruding portion 118a and the protruding portion 118a is connected to and protrudes from the leaning portion 118b. With such disposition, when the heat dissipation fan 118 is raised toward the opening 112a by the lifting mechanism 114, the protruding portion 118a protrudes from the outer surface 112b through the opening 112a, and the leaning portion 118b is leaned against an inner surface 112c of the housing 112 opposite to the outer surface 112b. Therefore, when the demand of heat dissipation of the portable electronic device 100 is greater than a predetermined level, the air inlet 118c of the heat dissipation fan 118 can protrude from the outer surface 112b of the housing 112 along with the protruding portion 118a in order to significantly increase the heat convection of the heat dissipation fan 118, thereby significantly increase the heat dissipation efficiency of the heat dissipation fan 118.

To summarize the above, in the invention, the opening is disposed on the housing, the heat dissipation fan is disposed on the lifting mechanism, and the control unit is coupled to the lifting mechanism to control the lifting mechanism to move toward or away from the opening, thereby moving the heat dissipation fan to protrude from the outer surface of the housing or back into the housing to the initial position.

With such disposition, when the portable electronic device has higher demand for heat dissipation, such as when the portable electronic device is switched to an overclock mode, or when the working temperature of the portable electronic device exceeds the predetermined temperature, the control unit controls the lifting mechanism to raise the heat dissipation fan to protrude from the outer surface of the housing, which causes the airflow volume of the heat dissipation fan to increase significantly, thereby increasing the volume of air discharge of the heat dissipation fan and the heat convection of the portable electronic device, thus significantly increasing the heat dissipation efficiency of the portable electronic device.

When the working temperature the portable electronic device returns back to normal working mode or normal working temperature, the control unit can control the lifting mechanism to lower the heat dissipation fan back to the initial position in the housing and continue to dissipate heat in the normal mode. As a result, the invention can effectively increase the heat dissipation efficiency of the portable electronic device.

Although the invention has disclosed the above through the embodiments, the embodiments are not used to limit the invention. Any person having ordinary skill in the art without deviating from the teachings and scope of the invention can make adjustments and fine-tunes; therefore, the scope of the invention are determined by the claims of the invention.

What is claimed is:

1. A portable electronic device, comprising:
   a housing comprising an opening;
   a lifting mechanism movably disposed in the housing corresponding to the opening, wherein the lifting mechanism is configured to move toward to or away from the opening;
   a control unit coupled to the lifting mechanism and configured to control the lifting mechanism to move toward or away from the opening; and
   a heat dissipation fan disposed on the lifting mechanism and corresponding to the opening, wherein the heat dissipation fan is raised toward the opening with the lifting mechanism when the lifting mechanism moves toward the opening, and protrudes from an outer surface of the housing.

2. The portable electronic device as claimed in claim 1, wherein an operation of the control unit controlling the lifting mechanism to move toward the opening is executed in response to the portable electronic device switching to an overclock mode.

3. The portable electronic device as claimed in claim 2, wherein an operation of the control unit controlling the lifting mechanism to move away from the opening is executed in response to the portable electronic device switching back to a normal mode.

4. The portable electronic device as claimed in claim 1, wherein an operation of the control unit controlling the lifting mechanism to move toward the opening is executed in response to a working temperature of the portable electronic device exceeding a predetermined temperature.

5. The portable electronic device as claimed in claim 4, wherein an operation of the control unit controlling the lifting mechanism to move away from the opening is executed in response to the working temperature of the portable electronic device decreased to equal to or below the predetermined temperature.

6. The portable electronic device as claimed in claim 1, wherein the heat dissipation fan comprises an air inlet corresponding to the opening, and when the heat dissipation fan is raised toward the opening with the lifting mechanism, the air inlet protrudes from the outer surface through the opening.

7. The portable electronic device as claimed in claim 6, wherein the heat dissipation fan comprises a protruding portion and a leaning portion, the air inlet is disposed at the protruding portion, the protruding portion is connected to and protrudes from the leaning portion, when the heat dissipation fan is raised toward the opening with the lifting mechanism, the protruding portion protrudes from the outer surface through the opening, and the leaning portion is leaned against an inner surface of the housing opposite to the outer surface.

8. The portable electronic device as claimed in claim 1, further comprising a first body and a second body, wherein the first body comprises the housing, and the second body is coupled to the first body, so as to rotate with respect to the first body.

9. The portable electronic device of claim 8, wherein the first body further comprises a keyboard module.

10. The portable electronic device as claimed in claim 8, wherein the outer surface is a surface of the first body facing the second body.

* * * * *